United States Patent [19]

Fukuda et al.

[11] Patent Number: 5,082,760
[45] Date of Patent: * Jan. 21, 1992

[54] METHOD FOR PREPARING AN ELECTROPHOTOGRAPHIC PHOTORECEPTOR HAVING A CHARGE TRANSPORTING LAYER CONTAINING ALUMINUM OXIDE

[75] Inventors: Yuzuru Fukuda; Masayuki Nishikawa; Shigeru Yagi; Ken-ichi Karakida, all of Kanagawa, Japan

[73] Assignee: Fuji Xerox Co., Ltd., Tokyo, Japan

[ * ] Notice: The portion of the term of this patent subsequent to Oct. 23, 2007 has been disclaimed.

[21] Appl. No.: 264,748

[22] Filed: Oct. 31, 1988

[30] Foreign Application Priority Data

Nov. 10, 1987 [JP] Japan ................................. 62-282236
Mar. 4, 1988 [JP] Japan ................................. 63-49608

[51] Int. Cl.⁵ .......................... G03G 15/02; G03G 5/00
[52] U.S. Cl. ...................................... 430/127; 430/58; 430/128
[58] Field of Search .......................... 430/127, 128, 58

[56] References Cited

U.S. PATENT DOCUMENTS

| | | | |
|---|---|---|---|
| 4,225,222 | 9/1980 | Kempter | 430/95 X |
| 4,265,991 | 5/1981 | Hirai et al. | 430/95 X |
| 4,369,242 | 1/1983 | Arimilli et al. | 430/58 |
| 4,634,648 | 1/1987 | Jansen et al. | 430/95 X |
| 4,714,668 | 12/1987 | Uneno et al. | 430/316 |
| 4,739,429 | 4/1988 | Mort et al. | 430/58 |
| 4,965,164 | 10/1990 | Fukuda et al. | 430/128 |

FOREIGN PATENT DOCUMENTS

| | | | |
|---|---|---|---|
| 54-78135 | 6/1979 | Japan . | |
| 54-86341 | 7/1979 | Japan . | |
| 62-9355 | 1/1987 | Japan . | |
| 63-63051 | 3/1988 | Japan | 430/58 |

*Primary Examiner*—Marion E. McCamish
*Assistant Examiner*—Stephen C. Crossan
*Attorney, Agent, or Firm*—Finnegan, Henderson, Farabow, Garrett and Dunner

[57] ABSTRACT

A method for preparing an electrophotographic photoreceptor is disclosed, which comprises a substrate having thereon a charge generating layer containing an amorphous silicon as a main component and a charge transporting layer containing aluminum oxide as a main component, wherein the charge transporting layer is formed by an ion plating method while introducing oxygen gas.

15 Claims, No Drawings

METHOD FOR PREPARING AN ELECTROPHOTOGRAPHIC PHOTORECEPTOR HAVING A CHARGE TRANSPORTING LAYER CONTAINING ALUMINUM OXIDE

FIELD OF THE INVENTION

The present invention concerns electrophotographic photoreceptors. Particularly, it concerns a method for preparing an amorphous silicon based electrophotographic photoreceptors.

BACKGROUND OF THE INVENTION

Several recent developments have occurred in electrophotographic photoreceptor technology. New photoreceptors have a vapor deposited photosensitive layer consisting principally of amorphous silicon. This trend has developed because amorphous silicon photoreceptors have an increased life expectancy over conventional electrophotographic photoreceptors. The application of amorphous silicon to electrophotographic photoreceptors results in more electrically stable repeat characteristics, increased hardness, greater thermal stability, and a longer life expectancy.

In the past, a variety of amorphous silicon based electrophotographic photoreceptors have been proposed, for example, JP-A-54-78135 and JP-A-54-86341 (the term "JP-A" as used herein refers to a "published unexamined Japanese patent application").

Of these, a superior embodiment comprises an amorphous silicon based electrophotographic photoreceptor with functionally separated photosensitive layers. These layers include a charge generating layer wherein charge carriers are generated upon irradiation with light, and a charge transporting layer into which the charge carriers can be injected and transferred efficiently. The photosensitive layers include amorphous silicon films formed by glow-discharging a mixed gas comprising a gas of silane compounds such as silane or disilane, a gas containing carbon, oxygen or nitrogen, and a gas containing very small amounts of group III or group V elements. The amorphous silicon based electrophotographic photoreceptor just described was proposed in JP-A-62-9355.

In general, electrophotographic photoreceptors in which the charge transporting layer and the charge generating layer are functionally separated display charging properties which are affected by the characteristics of the charge transporting layer which comprises the largest portion of the photosensitive layer. The chargeability of an electrophotographic photoreceptor including a hydrogenated amorphous silicon film obtained by means of the glow discharge of the silane compounds mentioned above is about 30 V/$\mu$m or less. This figure is still inadequate. Further, the dark decay rate, which differs according to the conditions of use, in general, is very high, being at least some 20%/second. Consequently, electrophotographic photoreceptors which have an amorphous silicon based charge transporting layer of this type are limited to use in comparatively high speed systems. Otherwise, a specific development system is required since an adequate charge potential cannot be obtained. The thickness of the charge transporting layer can be increased in order to increase the charge potential, but this not only increases the time required to produce the film but also increases the probability of defects being produced while forming the film.

The prior art reference JP-A-63-63051 (corresponding to U.S. Pat. application Ser. No. 93,285) taught the use of an aluminum oxide film to function as the charge transporting layer.

However, when an aluminum oxide film is formed by methods such as ion plating or electron beam vapor deposition, cracks are generated on the film depending on various formation conditions, and transparency of the film deteriorates. Accordingly, when such a cracked aluminum oxide film is used as the charge transporting layer, the obtained electrophotographic photoreceptor displays unstable electric characteristics, and produces defective images.

The present invention was developed in view of problems of the conventional techniques such as those discussed above.

SUMMARY OF THE INVENTION

An object of the present invention is to provide a method for preparing an electrophotographic photoreceptor which has a novel charge transporting layer. That is, the method of the present invention shall prepare an electrophotographic photoreceptor which has a hard charge transporting layer, excellent transparency and extremely few or no cracks. Further, the photoreceptor will have excellent electrophotographic properties, including stabilized electric characteristics, and will produce fewer defective images.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

The above object can be attained by a method for preparing an electrophotographic photoreceptor which comprises a substrate having thereon a charge generating layer containing an amorphous silicon as a main component, and a charge transporting layer containing aluminum oxide as a main component, wherein said charge transporting layer is formed by an ion plating method while introducing oxygen gas.

That is, to achieve the foregoing objects, and in accordance with the purposes of the present invention as embodied and broadly described herein, a method is provided for preparing an electrophotographic photoreceptor which comprises a first step of forming a charge generating layer containing amorphous silicon on a substrate. Next, a charge transporting layer containing aluminum oxide ($Al_2O_3$) is formed by a ion plating method while introducing oxygen gas.

Another embodiment of the present invention includes a method for preparing an electrophotographic photoreceptor which comprises a first step of forming a charge transporting layer containing aluminum oxide ($Al_2O_3$) on a substrate. Next, a charge generating layer containing amorphous silicon is formed.

DETAILED DESCRIPTION OF THE INVENTION

Reference will now be made in detail to the present preferred embodiment of the present invention Either an electrically conductive substrate or an insulating support can be used as the substrate element in the present invention. When an insulating substrate is used, it must be treated in such a way that at least the surface which is in contact with the other layers is rendered electrically conductive. Metals or alloys such as stainless steel or aluminum can be used as the electrically conductive substrate. Synthetic resin films or sheets of polyester, polyethylene, polycarbonate, polystyrene, polyamide; glass; ceramic; and paper can be used as the insulating substrate.

A charge generating layer of which amorphous silicon forms the principal component is formed on the upper side of the substrate. This layer can be formed using one of several known methods. For example, it may be formed using a glow discharge decomposition method, a sputtering method, an ion plating method, a vacuum vapor deposition method, or any other method known in the art. The film forming method can be selected according to the intended purpose. However, the preferred method is a plasma CVD method, in which silane or a silane based gas is decomposed in a glow discharge. If such a method is used, it is possible to form films containing a suitable amount of hydrogen in the film and having ideal characteristics such as a comparatively high dark resistance, a high photosensitivity, and containing a suitable amount of hydrogen in the film An example of the plasma CVD method is described below.

Silanes, principally silane and disilane, or a gas obtained using silicon crystals, are used as the raw material gases in formation of a charge generating layer. A carrier gas such as hydrogen, helium, argon, and neon can also be used when forming the charge generating layer. Gases such as diborane ($B_2H_6$) gas, and phosphine ($PH_3$) gas can be mixed with these raw material gases to include doped impurity elements such as boron or phosphorus in the film. Further, halogen atoms, carbon atoms, oxygen atoms, and nitrogen atoms can also be included in order to increase the dark resistance, increase the photosensitivity or increase the charging capacity. Moreover, elements such as germanium and tin may also be included in order to increase sensitivity of the photoreceptor in the long wavelength region.

The charge generating film generally has silicon for its principal component. The content of hydrogen is desirable in an atomic percentage range of 1 to 40%, with a range of 5 to 20% being preferable. The film thickness is established generally within a range from 0.1 to 30 $\mu$m, and preferably within a range from 0.2 to 5 $\mu$m.

When an alternating current discharge is being used, the film forming conditions are established appropriately as follows: frequency of from 50 Hz to 5 GHz, a reaction pressure within the reactor of from $1 \times 10^{-4}$ to 10 torr, a discharge power of from 10 to 2,000 W, and a substrate temperature of from 30° to 600° C. The thickness of the charge generating layer can be established as desired by adjusting the discharge period.

The charge transporting layer generally has oxides of aluminum forming the principal component. This layer is formed on the upper part or the lower part of the charge generating layer. This layer is transparent to visible light and has essentially no photosensitivity in the visible light region. It may, however, be photosensitive to ultraviolet light.

The charge transporting layer can only be formed using an ion plating method. Though aluminum or aluminum oxides can be used as the raw material, preferably aluminum oxide ($Al_2O_3$) can be used. In practical terms, the raw material is placed in an oxygen free copper crucible which can be water cooled, located inside the vacuum chamber of the ion plating apparatus. The film forming conditions are as follows: vacuum inside the vacuum chamber $1 \times 10^{-5}$ to $1 \times 10^{-7}$ torr, voltage applied to the ionizing electrode +1 to +500 V, bias voltage applied to the substrate 0 to −2,000 V, electron gun voltage 0.5 to 50 kV, electron gun current 0.5 to 1,000 mA. Further, the substrate temperature is set at 20° to 1,000° C.

In the method of the present invention, oxygen gas is introduced directly and separately into the vacuum chamber. The amount of oxygen gas introduced can be controlled by means of the oxygen gas pressure inside the vacuum chamber. That is to say, after evacuating the inside of the vacuum chamber to the vacuum indicated above, oxygen gas is introduced in such an amount that the vacuum is generally within the range from $1 \times 10^{-6}$ to $1 \times 10^2$ torr, and preferably within the range from $1 \times 10^{-4}$ to $1 \times 10^{-1}$ torr. In this case, the transparency of the film decreases if the volume of oxygen gas introduced is small. However, the introduction of a higher volume of oxygen gas reduces the extent of crack formation in the resultant film. If too much oxygen gas is introduced, the film becomes excessively soft. Clearly, the amount of oxygen must be established within a suitable range.

Further, the thickness of the charge transporting film can be established appropriately by adjusting the ion plating time period. In the present invention, film thickness is generally set within the range from 2 to 100 $\mu$m, and preferably within the range from 3 to 30 $\mu$m.

Other layers may be formed, if desired, adjacent to the upper part or the lower part of either the charge generating layer or the charge transporting layer. Examples of such layers are described below. Layers, such as, p-Type semiconductor and n-type semiconductor layers, in which elements of group III or group V of the Periodic Table have been added to amorphous silicon, for example, or insulating layers such as layers of silicon nitride, silicon carbide, silicon oxide, and amorphous carbon, can be used as a charge injection preventing layers. Further, layers obtained by adding nitrogen, carbon, or oxygen to layers consisting of amorphous silicon can be used as adhesive layers. Moreover, layers which control the electrical and image forming characteristics of the Photoreceptor such as layers which contain elements of group IIIB and elements of group V of the Periodic Table at the same time, can also be used. The thickness of each of these layers can be set arbitrarily, but it is normally set within the range from 0.01 $\mu$m to 10 um.

Moreover, a surface protecting layer may be established to prevent degeneration of the surface of the photoreceptor by corona ions.

Each of the above-mentioned layers can be formed using the plasma CVD method. As described in connection with the charge generating layer, when impurity elements are added, a gaseous substance containing the impurity elements is introduced along with silane gas into the plasma CVD apparatus, and the mixture is subjected to glow discharge decomposition. Either an alternating current discharge or a direct current discharge can be used effectively for forming the films of each layer. When an alternating current discharge is used, the film forming conditions are as follows: the frequency normally ranges from 0.1 to 30 MHz and preferably 5 to 20 MHz, the vacuum during the discharge ranges generally from $1 \times 10^{-4}$ to 10 torr and preferably from 0.1 to 5 torr (13.3 to 66.7 Pa) and the substrate temperature ranges generally from 30° to 600° C., and preferably from 100° to 400° C.

EXAMPLE

The method of the present invention is further described by means of the following examples.

EXAMPLE 1

An a-Si:H film having a thickness of 1 μm was formed on an aluminum pipe of diameter 120 mm. That is to say, silane gas was introduced at a rate of 200 ml/min. into a capacitive coupled type plasma CVD apparatus. The pressure was set at 1.5 torr. The temperature of the substrate was set at 250° C. Glow discharge decomposition was carried out for 10 minutes with a 300 W, 13.56 MHz high frequency output.

The above-mentioned aluminum pipe was then introduced into the vacuum chamber of an ion plating apparatus. Next, 99.99% of alumina ($Al_2O_3$) was introduced into the water cooled oxygen free copper crucible in the vacuum chamber, and the chamber was evacuated with a vacuum pump to a vacuum of $1 \times 10^{-6}$ torr, after which oxygen was introduced into the chamber until the pressure was $2 \times 10^{-4}$ torr. A voltage of 8.5 kV was applied to the electron gun with the power supply output set to provide a current of 240 mA. At this time, the ionizing electrode was set at 80 V and a bias voltage of −500 V was applied to the substrate itself. The electron beam output was adjusted in such a way that the deposition rate, according to a quartz oscillator film thickness monitor established in the vicinity of the aluminum pipe, was held constant at 34 Å/sec. A charge transporting layer consisting of an aluminum oxide film having a thickness of about 5 um was formed in this way with a film forming time of approximately 25 minutes.

The sample was then removed from the vacuum chamber. Investigation of the charge transporting layer confirmed that the aluminum oxide film which had been formed was transparent and that there were extremely few cracks in the film. Moreover, the film was a very hard film having a Vickers hardness (10 gram load) of 680.

EXAMPLE 2

An electrophotographic photoreceptor was made by the same way as in Example 1 except that oxygen gas was introduced to a pressure of $7 \times 10^{-4}$ torr. The charge transporting layer formed was transparent and had no cracks. The Vickers hardness (10 gram load) was 500.

COMPARATIVE EXAMPLE 1

An electrophotographic photoreceptor was made by the same way as in Example 1 except that no oxygen was introduced. The charge transporting layer formed was black in color and there were many cracks in the film. Furthermore, the Vickers hardness (10 gram load) was 200 and the film lacked strength.

EXAMPLE 3

An aluminum pipe having a diameter of about 120 mm was introduced into the vacuum chamber of an ion plating apparatus. Next, 99.9% alumina ($Al_2O_3$) was introduced into the water cooled oxygen free copper crucible in the vacuum chamber. The chamber was evacuated with a vacuum pump to a vacuum of $2 \times 10^{-6}$ torr, after which oxygen was introduced into the chamber until the pressure was $2 \times 10^{-4}$ torr. A voltage of 8.5 kV was applied to the electron gun with the power supply output set to provide a current of 240 mA. At this time, the ionizing electrode was set at 70 V and a bias voltage of −400 V was applied to the substrate itself. The electron beam output was adjusted in such a way that the deposition rate, according to a quartz oscillator film thickness monitor established in the vicinity of the aluminum pipe was held constant at 31 Å/sec. A charge transporting layer consisting of an aluminum oxide film having a thickness of about 5 μm was formed in this way with a film forming time of approximately 25 minutes.

The layer was removed from the vacuum chamber. Investigation of the charge transporting layer confirmed that the aluminum oxide film which had been formed was transparent and that there were no cracks in the film. Moreover, the film was very hard film having a Vickers hardness (10 gram load) of 675.

Successively, an a-Si:H film having a thickness of 1 μm was formed on a charge transporting layer described above. That is, silane gas was introduced at a rate of 200 ml/min. into a capacitive coupled type plasma CVD apparatus and the pressure was set at 1.5 torr. The temperature of the substrate was wet at 250° C. Glow discharge decomposition was carried out for 10 minutes with a 300 W, 13.56 MHz high frequency output.

The thus-obtained electrophotographic photoreceptor had an excellent surface property, and an excellent electric characteristic. Further, it produced a copied image with no defects.

COMPARATIVE EXAMPLE 2

An electrophotographic photoreceptor was made by the same way as in Example 3 except that no oxygen was introduced. The charge transporting layer formed was black in color and there were many cracks in the film. Furthermore, the Vickers hardness (10 gram load) was 180 and the film lacked strength.

The thus-obtained electrophotographic photoreceptor had a deteriorated surface property, unstable electric property, and several defects on a copied image.

Thus, it is possible, by means of the present invention, to manufacture electrophotographic photoreceptors which comprise novel charge transporting layers having excellent transparency, no cracks and a high hardness using aluminum or oxides thereof. Hence, the electrophotographic photoreceptors manufactured by means of the present invention have excellent durability, excellent electrophotographic characteristics and excellent image properties.

While the invention has been described in detail and with reference to specific embodiments thereof, it will be apparent to one skilled in the art that various changes and modifications can be made therein without departing from the spirit and scope thereof.

What is claimed is:

1. An electrophotographic photoreceptor, comprising
   a substrate;
   a charge generating layer overlying said substrate for generating charge carriers upon irradiation with light; and
   a generally transparent charge transport layer, including aluminum oxide ion plate overlaying said charge generating layer, for receiving and transferring the charge carriers.

2. An electrophotographic photoreceptor according to claim 1, wherein said charge transport layer has a thickness in a range of 2 mm to 100 mm.

3. An electrophotographic photoreceptor according to claim 1, wherein said charge transport layer consists essentially of aluminum oxide.

4. An electrophotographic photoreceptor, comprising:
   a substrate;
   a generally transparent charge transport layer, including aluminum oxide ion plate overlaying said substrate; and
   a charge generating layer overlaying said charge transport layer for generating charge carriers upon irradiation with light, wherein the charge carriers are received and transferred by said charge transport layer.

5. An electrophotographic photoreceptor according to claim 4, wherein said charge transport layer has a thickness in a range of 2 mm to 100 mm.

6. An electrophotographic photoreceptor according to claim 4, wherein said charge transport layer consists essentially of aluminum oxide.

7. A method for preparing an electrophotographic photoreceptor having a charge generating layer for generating charge carriers and a charge transporting layer for transferring charge carriers, the charge generating layer containing amorphous silicon an the charge transporting layer being generally transparent to visible light and containing aluminum oxide, comprising the steps of:
   preparing a substrate in a vacuum chamber;
   forming the charge generating layer; and
   ion plating at least one compound from the group consisting of aluminum and aluminum oxide in an oxygen atmosphere to form the generally transparent charge transporting layer.

8. The method of claim 7, wherein the step of forming a charge generating layer includes subjecting the substrate to a glow discharge of silane gas.

9. The method of claim 7, wherein the step of forming a charge generating layer includes forming said layer having a range of 1 to 40 atomic weight % of hydrogen.

10. The method of claim 7, wherein the step of forming a charge generating layer includes forming said layer having a thickness in a range of 0.1 μmm to 30 mm.

11. The method of claim 7, wherein the step of ion plating the charge transporting layer in an oxygen atmosphere includes a substep of creating a vacuum in said vacuum chamber, and introducing oxygen gas to reduce the vacuum to a range of $10^{-6}$ torr to $10^{-2}$ torr.

12. The method of claim 7, wherein the step of forming a charge transporting layer includes a substep of ion plating said one of the metals for a selected time to produce said layer of aluminum oxide having a thickness in a range of 2 μm to 100 μm.

13. The method of claim 2, wherein said ion plating step includes selecting the compound such that the charge transporting layer consists essentially of aluminum oxide.

14. A method for preparing an electrophotographic photoreceptor having a charge generating layer for generating charge carriers and a charge transporting layer for transferring charge carriers, the charge generating layer containing amorphous silicon and the charge transporting layer being generally transparent to visible light and containing aluminum oxide comprising the steps of:
   preparing a substrate n a vacuum chamber;
   subjecting the substrate to an oxygen atmosphere;
   ion plating on the substrate at least one compound selected from the group consisting of aluminum and aluminum oxide in said oxygen atmosphere to form the generally transparent charge transporting layer; and
   forming the charge generating layer including amorphous silicon on the charge transporting layer.

15. A method for preparing an electrophotographic photoreceptor having a charge generating layer for generating charge carriers and a charge transporting layer for transferring charge carriers, the charge generating layer containing amorphous silicon and the charge transporting layer being generally transparent to visible light and containing aluminum oxide, comprising the steps of:
   preparing a substrate in a vacuum chamber;
   forming the charge generating layer including amorphous silicon on said substrate;
   subjecting the substrate and charge generating layer to an oxygen atmosphere; and
   ion plating on the charge generating layer at least one compound selected from the group consisting of aluminum and aluminum oxide in said oxygen atmosphere to form the generally transparent charge transporting layer.

* * * * *

UNITED STATES PATENT AND TRADEMARK OFFICE
CERTIFICATE OF CORRECTION

PATENT NO. : 5,082,760
DATED : January 21, 1992
INVENTOR(S) : Yuzuru Fukuda et al.

It is certified that error appears in the above-identified patent and that said Letters Patent is hereby corrected as shown below:

Claim 1, column 6, lines 61-62, after "comprising" insert --:--.

Claim 1, column 6, line 64, change "overlying" to --overlaying--.

Claim 1, column 6, line 68, change "plate" to --plated--.

Claim 4, column 7, line 13, change "plate" to --plated--.

Claim 7, column 7, line 30, after "silicon" change "an" to --and--.

Claim 10, column 7, line 49, change "umm" to --mm--.

Claim 13, column 8, line 11, change "claim 2" to --claim 7--.

UNITED STATES PATENT AND TRADEMARK OFFICE
CERTIFICATE OF CORRECTION

PATENT NO. : 5,082,760
DATED : January 21, 1192
INVENTOR(S) : Yuzuru Fukuda et al.

It is certified that error appears in the above-indentified patent and that said Letters Patent is hereby corrected as shown below:

Claim 14, column 8, line 23, change "n" to --in--.

Signed and Sealed this

Twenty-ninth Day of June, 1993

Attest:

MICHAEL K. KIRK

*Attesting Officer*  *Acting Commissioner of Patents and Trademarks*